US009287353B2

(12) United States Patent
Kitada et al.

(10) Patent No.: US 9,287,353 B2
(45) Date of Patent: Mar. 15, 2016

(54) COMPOSITE SUBSTRATE AND METHOD OF MANUFACTURING THE SAME

(71) Applicant: Kyocera Corporation, Kyoto-shi, Kyoto (JP)

(72) Inventors: Masanobu Kitada, Ohmihachiman (JP); Motokazu Ogawa, Kyoto (JP); Yoshiyuki Kawaguchi, Hirakata (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/056,558

(22) Filed: Oct. 17, 2013

(65) Prior Publication Data

US 2014/0042598 A1 Feb. 13, 2014

Related U.S. Application Data

(63) Continuation-in-part of application No. 13/990,262, filed as application No. PCT/JP2011/077677 on Nov. 30, 2011, now abandoned.

(30) Foreign Application Priority Data

Nov. 30, 2010 (JP) .................................. 2010-266111
Nov. 30, 2010 (JP) .................................. 2010-266112

(51) Int. Cl.
*H01L 29/32* (2006.01)
*H01L 29/36* (2006.01)
*H01L 29/06* (2006.01)
*H01L 21/762* (2006.01)
*H01L 21/22* (2006.01)

(52) U.S. Cl.
CPC ............ *H01L 29/0607* (2013.01); *H01L 21/22* (2013.01); *H01L 21/2205* (2013.01); *H01L 21/76256* (2013.01); *H01L 29/36* (2013.01)

(58) Field of Classification Search
CPC ..................... H01L 21/76256; H01L 29/0607; H01L 21/02; H01L 29/32; H01L 21/0257; H01L 29/06; H01L 21/22; H01L 29/36; H01L 21/762
See application file for complete search history.

(56) References Cited

U.S. PATENT DOCUMENTS 3,902,979 A * 9/1975 Thomas .......................... 428/214
3,997,381 A * 12/1976 Wanlass ........................... 438/10

(Continued)

FOREIGN PATENT DOCUMENTS

| JP | 08191138 | 7/1996 |
|---|---|---|
| JP | 10012547 | 1/1998 |

(Continued)

OTHER PUBLICATIONS

International Search Report, PCT/JP2011/077677, Dec. 21, 2011, 2 pp.

(Continued)

*Primary Examiner* — Tan N Tran
*Assistant Examiner* — Fazli Erdem
(74) *Attorney, Agent, or Firm* — Volpe and Koenig, P.C.

(57) ABSTRACT

A composite substrate which includes a silicon layer having less lattice defects is provided. A composite substrate includes an insulating substrate and a functional layer of which one main surface is bonded to an upper surface of the substrate. A dopant concentration of the functional layer decreases from the other main surface toward the substrate side in a thickness direction of the functional layer.

13 Claims, 11 Drawing Sheets

(56) References Cited

U.S. PATENT DOCUMENTS

| | | | |
|---|---|---|---|
| 5,492,859 A * | 2/1996 | Sakaguchi et al. | 438/459 |
| 5,670,411 A * | 9/1997 | Yonehara et al. | 438/459 |
| 6,613,678 B1 * | 9/2003 | Sakaguchi et al. | 438/695 |
| 2003/0087503 A1 * | 5/2003 | Sakaguchi et al. | 438/406 |
| 2004/0241958 A1 * | 12/2004 | Guarini et al. | 438/455 |
| 2005/0074954 A1 * | 4/2005 | Yamanaka | 438/458 |
| 2005/0282306 A1 | 12/2005 | Yamanaka | |
| 2006/0057820 A1 | 3/2006 | Yamanaka | |
| 2006/0186560 A1 | 8/2006 | Swain et al. | |
| 2007/0235829 A1 | 10/2007 | Levine et al. | |
| 2009/0004883 A1 * | 1/2009 | Das et al. | 438/770 |
| 2009/0134397 A1 | 5/2009 | Yokoi et al. | |
| 2010/0062546 A1 | 3/2010 | Endo et al. | |
| 2010/0200944 A1 | 8/2010 | Levine et al. | |
| 2012/0037903 A1 | 2/2012 | Yokoi et al. | |
| 2012/0190150 A1 | 7/2012 | Levine et al. | |
| 2013/0299954 A1 * | 11/2013 | Kitada et al. | 257/655 |
| 2014/0042598 A1 * | 2/2014 | Kitada et al. | 257/655 |
| 2014/0167230 A1 * | 6/2014 | Kitada et al. | 257/650 |

FOREIGN PATENT DOCUMENTS

| | | |
|---|---|---|
| JP | 2004134672 | 4/2004 |
| JP | 2008530801 | 8/2008 |
| JP | 2009152565 | 7/2009 |
| JP | 2010087492 | 4/2010 |
| WO | 2006/086644 A2 | 8/2006 |

OTHER PUBLICATIONS

Korean Office Action, Korean Patent Application No. 10-2013-7008125, Mar. 13, 2014, 6 pp.

Extended European Search Report, European Patent Application No. 11845593.0, Feb. 13, 2015, 6 pgs.

* cited by examiner (a)

(b)

(c)

(a)

(b)

(c)

(a)

(b)

(a)

(b)

(c)

(a)

(b)

(c)

(a)

(b)

(a)

(b)

(a)

(b)

COMPOSITE SUBSTRATE AND METHOD OF MANUFACTURING THE SAME

CROSS REFERENCE TO RELATED APPLICATIONS

This application is a continuation-in-part of U.S. patent application Ser. No. 13/990,262, filed May 29, 2013, pending, which is a national stage entry of PCT/JP2011/077677, filed Nov. 30, 2011, which claims priority to Japanese patent application No. 2010-266111, filed Nov. 30, 2010, and Japanese patent application No. 2010-266112, filed Nov. 30, 2010, disclosure of all of which are incorporated herein by reference in its entirety.

FIELD OF INVENTION

The present invention relates to a composite substrate including a silicon layer and a method of manufacturing the composite substrate.

BACKGROUND

Recently, technologies to decrease parasitic capacitance for improving the performance of a semiconductor device have advanced. Examples of a technology to decrease the parasitic capacitance include an SOS (Silicon On Sapphire) structure. For example, examples of a method which forms the SOS structure include a technology which is disclosed in Japanese Unexamined Patent Publication JP-A 10-12547 (1998).

SUMMARY

However, in the technology disclosed in JP-A 10-12547 (1998), because lattice structures of silicon and sapphire are different to each other, lattice defects occur in the silicon.

Thereby, a composite substrate which includes a silicon layer having less lattice defects is required.

A method of manufacturing a composite substrate according to an embodiment of the invention includes: a step of preparing a first substrate which is formed of a first silicon having a dopant; a step of forming a semiconductor layer by forming a second silicon on a main surface of the first substrate by an epitaxial growth; a step of bonding the semiconductor layer and a second substrate of insulation; and a step of selectively etching the semiconductor layer from the first substrate side up to a middle portion in a thickness direction of the semiconductor layer using an etchant, as the etchant being used whose etching rate with respect to silicon is decreased by a not less than a constant value in a dopant concentration of a threshold which is lower than a dopant concentration of the first substrate, and in the step of forming a semiconductor layer, the semiconductor layer being formed so as to include a first region in a thickness direction, which first region is in contact with the first substrate and in which the dopant concentration is decreased down to the threshold with increase in distance from the first substrate.

A composite substrate according to an embodiment of the invention includes: an insulating substrate and a semiconductor layer of which one main surface is bonded to an upper surface of the insulating substrate, a dopant concentration of the semiconductor layer being decreased from an other main surface of the semiconductor layer toward the one main surface of the semiconductor layer which is on a substrate side.

A composite substrate according to another embodiment of the invention includes: an insulating substrate and a semiconductor layer of which one main surface is bonded to an upper surface of the insulating substrate, a dopant concentration of the semiconductor layer being increased from a middle portion in a thickness direction of the semiconductor layer toward another main surface of the semiconductor layer and from the middle portion in the thickness direction of the semiconductor layer toward the one main surface of the semiconductor layer which is on a substrate side.

According to the invention, a composite substrate which includes a silicon layer having less lattice defects can be provided.

DETAILED DESCRIPTION OF THE PREFERRED EMBODIMENTS

An example of an embodiment of a method of manufacturing a composite substrate of the invention will be described with reference to drawings.

First Embodiment

Method of Manufacturing Composite Substrate 40

Figure 1:
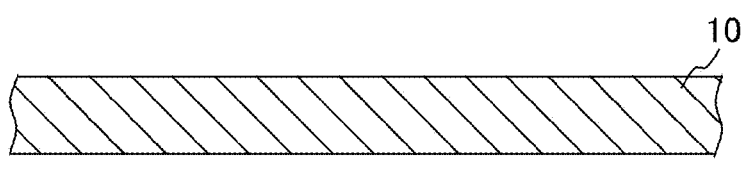
FIGS. 1(a) to 1(c) are cross-sectional views showing steps of a method of manufacturing a composite substrate according to an embodiment of the invention.
Figure 1:
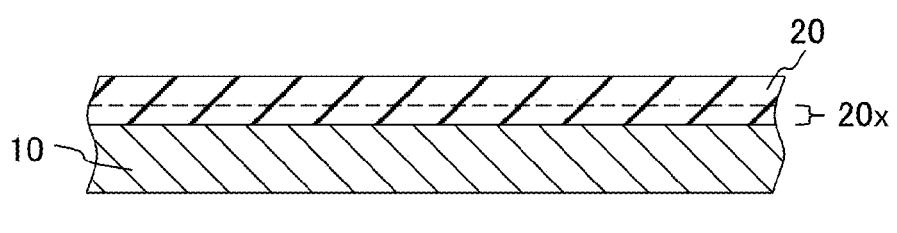
Figure 1:
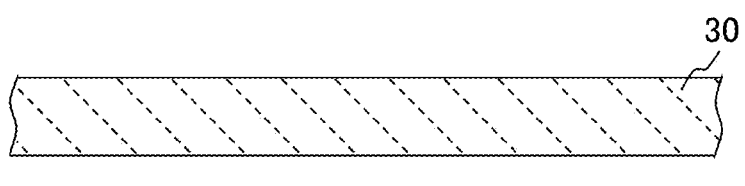

First, as shown in FIG. 1(a), a first substrate 10 which is formed of a first silicon (Si) including a dopant is prepared. As for the first silicon of the first substrate 10, p-type silicon or n-type silicon can be adopted. As for a dopant concentration of the first substrate 10, $p^{++}$ or $n^{++}$ dopant concentration having a relatively high concentration and $p^+$ and $n^+$ dopant concentration having a medium concentration can be adopted. The $p^{++}$ dopant concentration may be in a range of not less than $1 \times 10^{18}$ [atoms/cm$^3$] and not greater than $1 \times 10^{21}$ [atoms/cm$^3$]. The p$^+$ dopant concentration may be in a range of not less than $1 \times 10^{16}$ [atoms/cm$^3$] and less than $1 \times 10^{18}$ [atoms/cm$^3$]. The n$^{++}$ dopant concentration may be in a range of not less than $5 \times 10^{17}$ [atoms/cm$^3$] and not greater than $1 \times 10^{21}$ [atoms/cm$^3$]. The n$^+$ dopant concentration may be in a range of not less than $5 \times 10^{15}$ [atoms/cm$^3$] and less than $5 \times 10^{17}$ [atoms/cm$^3$]. In the present embodiment, the first substrate which is a p-type and in which the dopant concentration is p$^{++}$ is adopted. Note that superscripts "++" and "+" of "p" and "n" indicate the level of dopant concentration based on a resistivity of the silicon.

Subsequently, a second silicon is formed by an epitaxial growth on the upper surface in the arrow D1 direction side of the first substrate 10, and as shown in FIG. 1(b), a semiconductor layer 20 is formed. As for the method of the epitaxial growth, various methods can be adopted such as a thermal chemical vapor deposition (thermal CVD) in which gaseous silicon compound passes through the surface of the first substrate 10, is pyrolyzed, and is grown while the first substrate 10 is heated. Since the epitaxial growth is performed on the silicon substrate, compared to a case where the epitaxial growth is performed on a sapphire substrate, lattice defects of the semiconductor layer 20 can be decreased.

As for the semiconductor layer 20, a layer which is p-type or n-type silicon and in which the dopant is in a smaller concentration than in the first substrate 10 can be adopted. The semiconductor layer 20 is formed so that the dopant concentration is gradually decreased from the first substrate 10 side toward the upper surface side. A main surface of the semiconductor layer 20 of the side which does not contact the first substrate 10 is formed so as to have any one of p$^-$ and n$^-$ dopant concentration having relatively low concentration, and non-doped concentration. The p$^-$ dopant concentration may be in a range of less than $1 \times 10^{16}$ [atoms/cm$^3$]. The n$^-$ dopant concentration may be in a range of less than $5 \times 10^{15}$ [atoms/cm$^3$]. Here, the "non-doped silicon" means merely a silicon which is not intentionally doped with impurities, and is not limited to intrinsic silicon in which impurities are not included. The semiconductor layer 20 of the present embodiment adopts p-type silicon and is formed so that the dopant concentration of the upper surface portion is p$^-$. In addition, a superscript "–" of "p" and "n" is based on a resistivity of the silicon. The dopant concentration of the semiconductor layer 20 is controlled by adjusting a supply amount of impurities when the epitaxial growth is performed. Non-doped silicon can be formed by making the supply of impurities be zero. Moreover, the dopant concentration may be gradually changed due to a diffusion decrease of the dopants which is generated when the epitaxial growth is performed.

In this way, the semiconductor layer 20 is configured, and thus, the semiconductor layer 20 has a distribution of a dopant concentration in the thickness direction. In other words, the semiconductor layer 20 is formed so as to have a first region 20x in at least the thickness direction which first region is in contact with the first substrate 10. The first region 20x is formed so that the dopant concentration is decreased down to a threshold described below with increase in distance from the first substrate 10. In the present embodiment, the decrease of the dopant concentration is also continued from the threshold with increase in distance from the first region 20x.

In the above-described step, in the semiconductor layer 20, the epitaxial growth may not be performed until the diffusion concentration of the dopant is saturated. In this case, the formed epitaxial layer is configured by only a transition region in which the dopant concentration is gradually changed from the first substrate 10 side. For example, by leaving the dopant concentration of the epitaxial layer to an extent which slightly exceeds a boundary of dopant concentration (threshold described below) in which the etching speed of an etchant is greatly changed, the thickness of the epitaxial layer can be smaller due to the etching.

Subsequently, as shown in FIG. 1(c), a second substrate 30 of insulation is prepared. As for materials of forming the second substrate 30, aluminum oxide single crystal (sapphire), silicon carbide, or the like may be used. In the present embodiment, sapphire is adopted as the second substrate 30.

Figure 2:
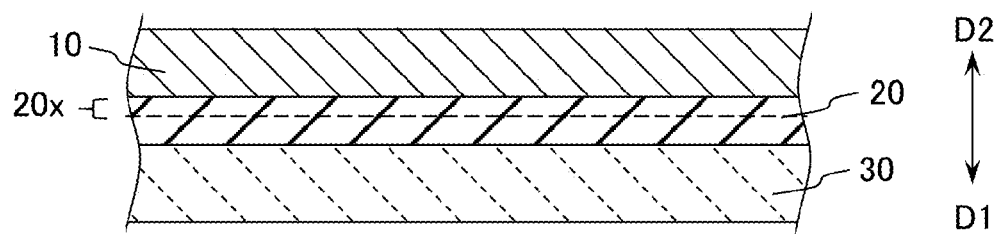
FIGS. 2(a) to 2(c) are cross-sectional views showing manufacturing steps after the steps of FIG. 1.
Figure 2:
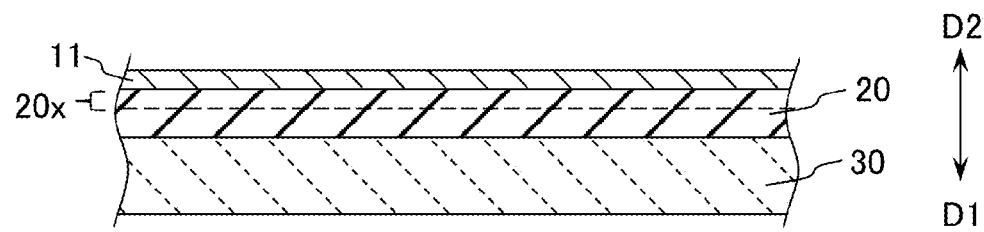
Figure 2:
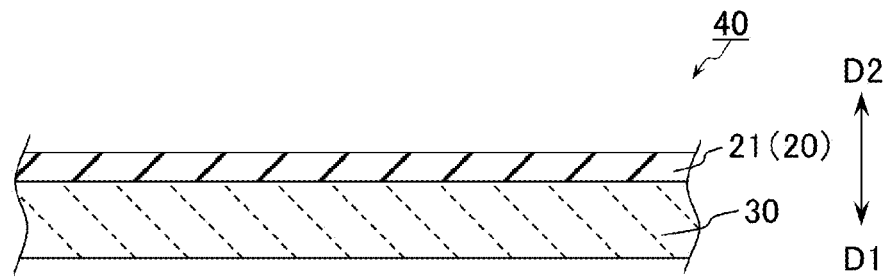

Subsequently, as shown in FIG. 2(a), the second substrate 30 and the main surface in the first direction side of the semiconductor layer 20 are bonded to each other. Examples of the bonding method include a method which performs the bonding by activating the surfaces to be bonded and a method which performs the bonding using an electrostatic force. For example, examples of the method which activates the surface include a method which performs activation by radiating with ion beams in a vacuum and etching the surface, and a method which activates by etching the surface in a chemical solution. The bonding may be performed at a normal temperature. As used herein, the term "normal temperature", while referring to a temperature which is substantially equal to a room temperature, is construed as encompassing temperatures that are lower than heating temperatures customarily adopted in substrate bonding technologies. More specifically, the normal temperature is 200° C. or lower.

In addition, at the time of the bonding, a method which does not use adhesive such as resin is adopted, and the semiconductor layer 20 and the second substrate 30 are directly bonded to each other by solid state bonding which uses interatomic force, or the like. At the time of the direct bonding, a combined layer may be formed between the semiconductor layer 20 and the second substrate 30. When the bonding is performed using the solid state bonding, it is preferable that surface roughness of the bonded surface of the semiconductor layer 20 and the second substrate 30 is small. For example, this surface roughness is represented by arithmetic average roughness Ra. A range of the surface roughness Ra may be less than 10 nm. By decreasing the average surface roughness Ra, the applied pressure when the semiconductor layer and the second substrate are bonded to each other can be decreased.

Through the steps up to here, an intermediate product, which includes the semiconductor layer 20 between the first substrate 10 and the second substrate 30, is produced.

Subsequently, as shown in FIG. 2(b), the thickness of the first substrate 10 is decreased by processing the intermediate product from the arrow D2 direction side. As for the processing method of decreasing the thickness, various methods such as abrasive grinding, chemical etching, or ion beam etching may be adopted, and a plurality of methods may be combined. Here, the first substrate in which the thickness is decreased becomes a first thin substrate 11.

In addition, as shown in FIG. 2(c), the thickness of the semiconductor layer 20 is decreased by performing etching using an etchant after the grinding. This etching can be performed by adopting a selective etchant (etching liquid) in which the etching speed is greatly changed due to difference of the dopant concentration. For example, examples of the selective etchant include a mixture of hydrofluoric acid, nitric acid and acetic acid, and a mixture of hydrofluoric acid, nitric acid and water. In the present embodiment, the mixture of hydrofluoric acid, nitric acid, and acetic acid is adopted as the etchant. In addition, in the etchant, an etching rate with respect to silicon is adjusted so as to be decreased by a not less than constant value in the dopant concentration of the threshold which is lower than the dopant concentration of the first substrate 10. Here, "the etching rate being decreased by a not less than constant value" indicates a case where the etching rate is decreased so that an inflection point appears when a graph showing a relationship between the etching rate and the dopant concentration is prepared or a case where the etching rate is decreased by $\frac{1}{10}$ or more in the threshold. In this example, in the present embodiment in which p-type silicon is adopted, the etchant is adjusted so that the etching speed is significantly decreased from a point of the threshold dopant concentration of $7\times10^{17}$ to $2\times10^{18}$ [atoms/cm$^3$] (a resistivity corresponding to this threshold falls in a range of 1 to 4 [Ω·cm]). When a mixture ratio of hydrofluoric acid, nitric acid, and water is set to 1:3:8, the etching rate is set so as to be changed to $\frac{1}{1000}$ or more from the point of the threshold. In addition, examples of other methods of performing the selective etching include an electric field etching method in a hydrogen fluoride solution of approximately 5%, and a pulse electrode anodizing method in a KOH solution. In the semiconductor layer 20, the first region 20$x$ is etched. Here, the semiconductor layer in which the thickness is decreased by etching becomes a functional layer 21. For example, the thickness of the functional layer 21 may be in a range of several hundreds of nm to about 2 μm. In addition, when the first substrate 10 or the first thin substrate 11 remains, the remaining first substrate 10 or the first thin substrate 11 is also etched.

Figure 3:
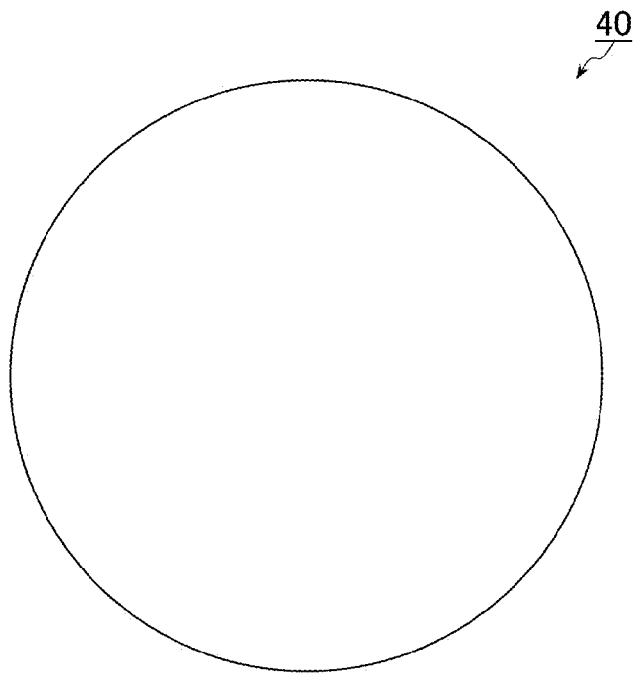
FIG. 3(a) is a plan view showing a schematic configuration of a composite substrate according to an embodiment of the invention.
FIG. 3(b) is a perspective view showing the composite substrate a part of which is viewed in cross section.
Figure 3:
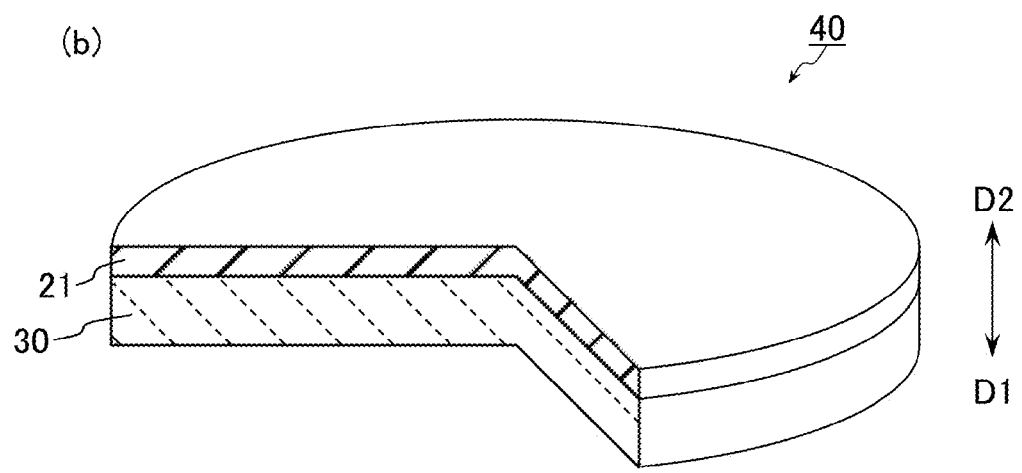

Through the steps up to here, as shown in FIG. 3, a composite substrate 40 can be manufactured in which the semiconductor layer 21 is laminated on the upper surface of the arrow D2 direction side of the insulating substrate 30. In other words, in the composite substrate 40, one main surface of the semiconductor layer 21 is bonded to the upper surface in the arrow D2 direction side of the substrate 30. In the dopant concentration of the semiconductor layer 21, the concentration of the bonded side (one main surface side; substrate 30 side) is lower than that of the other main surface side. Moreover, when the dopant concentration is considered as magnitude of electric resistance, the electric resistance of the semiconductor layer 21 is gradually decreased from the front side (the other main surface side) toward the bonded side (the one main surface side; substrate 30 side). In FIG. 3, the insulating substrate 30 indicates the second substrate 30 through the above-described manufacturing method, and the semiconductor layer 21 indicates the functional layer 21 in which the semiconductor layer 20 is thinned through the above-described manufacturing method.

In the above-described manufacturing method, gradient of the dopant concentration of the semiconductor layer 20 which becomes the functional layer 21 is formed on the surface of the side which is to be bonded to the second substrate 30 before being bonded to the second substrate 30. In this way, since the gradient is formed before the bonding, compared to a case where the gradient is formed after the bonding, unevenness of the thickness of the functional layer 21, which is formed on the upper surface of the second substrate 30, can be decreased. If the gradient is formed after the bonding, since the processing is performed from the first substrate 10 side, the functional layer is subjected to influence of unevenness of the thickness of the first substrate 10 or to influence of warping of the second substrate 30. A case where the functional layer in which the thickness is smaller than at least one of an unevenness amount of the thickness of the first substrate 10 and a warping amount of the second substrate 30 is formed is particularly effective. In the case of forming the functional layer 21 having such a thickness, if reduction in layer thickness is made with reference to the main surface of the first substrate 10 opposite to the second substrate 30, unevenness of the thickness of the functional layer 21 will be subject to influence of an unevenness amount of the thickness of the first substrate 10 and warping and undulation amounts of the second substrate 30, which makes it difficult to render the functional layer 21$a$ continuous film. Since reduction in layer thickness is made with reference to the main surface of the semiconductor layer 20 of the side in contact the first substrate 10, it is possible to eliminate the influence of unevenness of the thickness of the first substrate 10 and warping and undulation amounts of the second substrate 30. That is, even if the semiconductor layer 20 deforms in conformity to undulation of the second substrate 30 under the influence of connection with the second substrate 30, it is possible to obtain the functional layer 21 having uniform thickness in conformity to undulation of the second substrate 30. In general, it is said that there is the thickness unevenness of ±10 [μm] in the silicon wafer. The thickness unevenness is significantly larger than the value of submicron from several tens of nm to several hundreds of nm, which is the thickness required in silicon of an SOS substrate.

Moreover, in the above-described process step, the semiconductor layer 20 is formed by an epitaxial growth. Since the epitaxial growth is performed in a vacuum, the amount of oxygen contained in the film can be reduced significantly as compared with a silicon substrate pulledin air by CZ method. More specifically, the concentration of oxygen can be adjusted to be less than $1\times10^{18}$ [atoms/cm$^3$], and it has been confirmed that the oxygen concentration can be adjusted to be less than $3\times10^{17}$ [atoms/cm$^3$] by effecting the epitaxial growth under predetermined conditions. The oxygen concentration value of less than $1\times10^{18}$ [atoms/cm$^3$] is less than or equal to one-tenth of the oxygen concentration of a silicon substrate formed by the CZ method. In addition, through such a process step, the second substrate 30-sided surface of the semiconductor layer 20 formed by the epitaxial growth becomes a non-doped depletion layer which is low in oxygen concentration. That is, in the second substrate 30-sided surface of the semiconductor layer 20, strains appear extremely small. Such a configuration is desirable, because the surface of the side which is to be bonded to the second substrate 30 is not subjected to, for example, a stress resulting from unintentional strains.

In the above-described steps, in the semiconductor layer 20 of the second substrate 30 side, the dopant concentration is significantly low, and the electric resistance is high. According to this configuration, when a semiconductor-device-function portion is formed on the functional layer 21 of the composite substrate 40, improved characteristics of having smaller parasitic capacitance or noise can be realized.

After the manufacturing of the composite substrate 40, the composite substrate 40 may be polished precisionally. Uniformity of the thickness of the functional layer 21 can be improved due to the precision polishing. For example, examples of the etching means which is used in the fine etching include dry etching. Dry etching includes etching using a chemical reaction and etching using physical collision. Examples of etching using a chemical reaction include etching using reactive vapor (gas), etching using ions and ion beams, and etching using a radical. Examples of etching gas which is used for the reactive ion include sulfur hexafluoride (SF$_6$), and carbon tetrafluoride (CF$_4$). In addition, Examples of etching using physical collision include etching using ion beams. Examples of etching using ion beams include a method that uses a Gas Cluster Ion Beam (GCIB). It is possible to favorably perform the fine etching even with respect to a material substrate having a large area by scanning the substrate material 20x using a movable stage while etching the narrow region using the etching means.

In the above-described steps, the first substrate 10 is ground, and thus, the thickness is decreased. However, the grinding step may be omitted. When the grinding step is omitted, the first substrate 10 is removed by etching or the like.

In the above-described steps, a step in which the substrate is cleaned is not described. However, the substrate may be cleaned if necessary. Examples of a method of cleaning the substrate include various methods such as cleaning using ultrasonic waves, washing using an organic solvent, cleaning using chemicals, or cleaning using $O_2$ ashing. These cleaning methods may be adopted in combination.

In the above-described example, the case where the dopant concentration of the semiconductor layer 20 is continuously decreased with increase in distance from the first substrate 10 is described as an example. However, the invention is not limited to this example if it includes the first region 20x. For example, the dopant concentration of the region of the semiconductor layer 20 which is positioned on the side opposite to the first substrate 10 across the first region 20x may be equal to or more than the threshold, may be approximately equal to the threshold, and may be changed in stages in the thickness direction.

Second Embodiment

Method of Manufacturing Composite Substrate 40A

Figure 4:
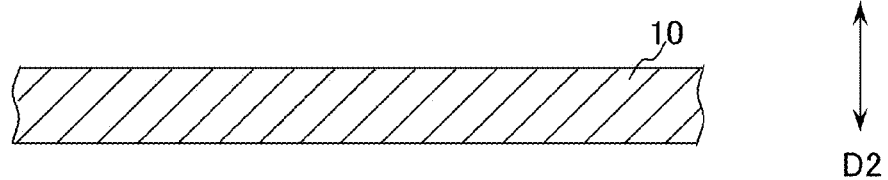
FIGS. 4(a) to 4(c) are cross-sectional views showing steps of a method of manufacturing a composite substrate according to an embodiment of the invention.
Figure 4:
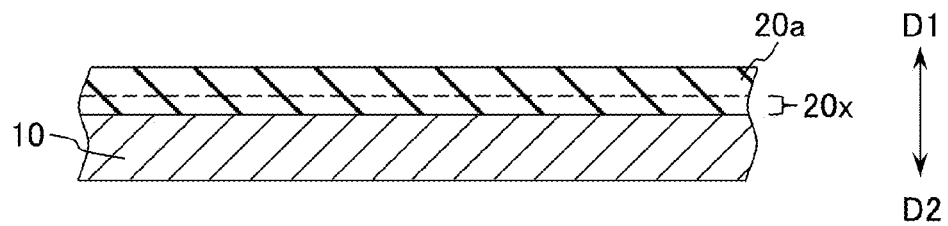
Figure 4:
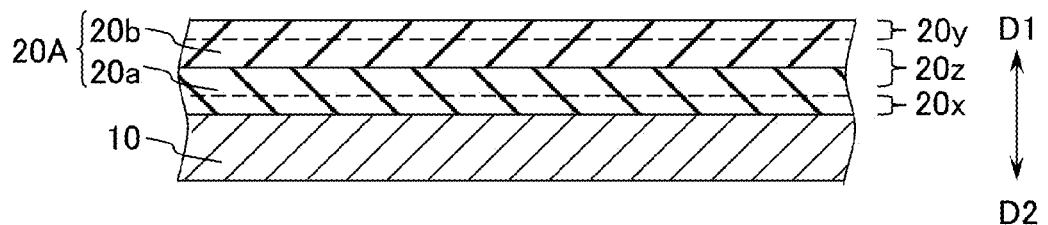
Figure 5:
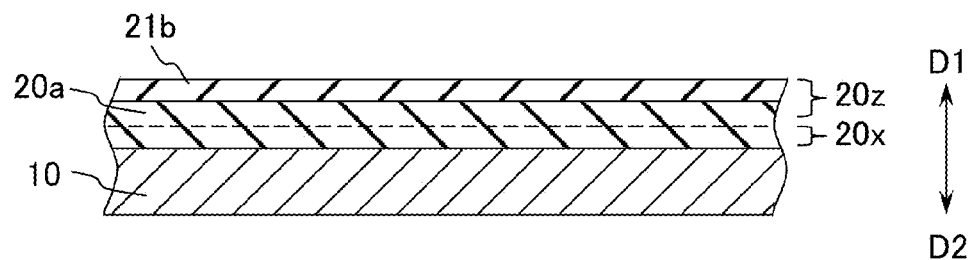
FIGS. 5(a) to 5(c) are cross-sectional views showing manufacturing steps after the steps of FIG. 4.
Figure 5:
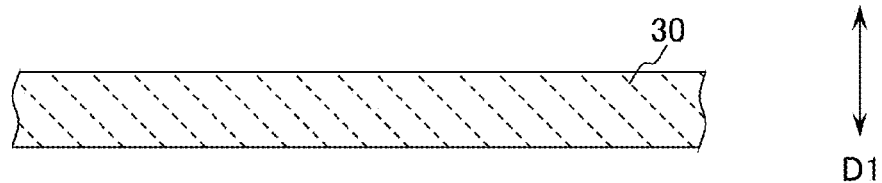
Figure 5:
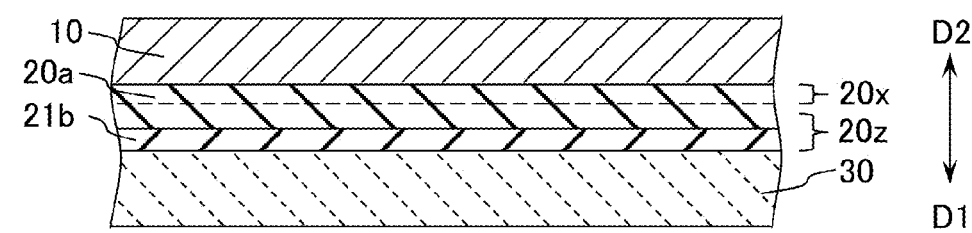
Figure 6:
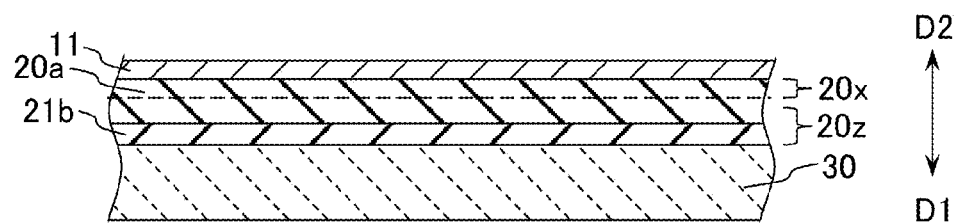
FIGS. 6(a) and 6(b) are cross-sectional views showing manufacturing steps after the steps of FIG. 5.
Figure 6:
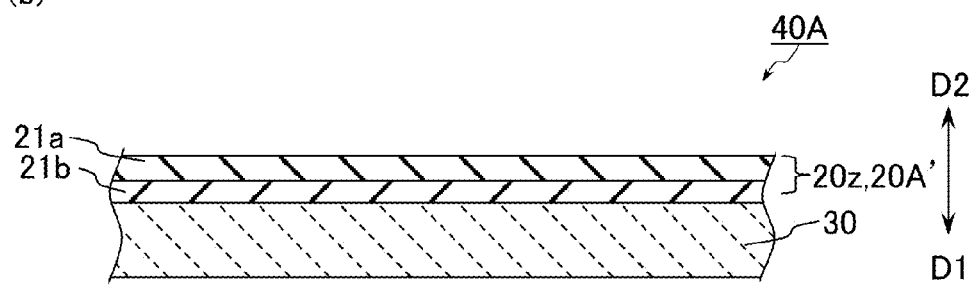

FIGS. 4 to 6 are process drawings schematically showing a method of manufacturing a composite substrate of an example of a second embodiment of the invention. Additionally, in the present example, portions different from the example of the above-described first embodiment are described, and overlapped descriptions with respect to the similar elements or steps are omitted.

First, as shown in FIG. 4(a), similar to FIG. 1(a), the first substrate 10 which is formed of silicon (Si) is prepared.

Subsequently, silicon is formed by an epitaxial growth on the upper surface in the arrow D1 direction side of the first substrate 10, and thus, a semiconductor layer 20A is formed. The semiconductor layer 20A is formed by laminating a first semiconductor layer 20a and a second semiconductor layer 20b in the order from the first substrate 10 side. Specifically, first, as shown in FIG. 4(b), the first semiconductor layer 20a is formed.

As for the first semiconductor layer 20a, a layer which is p-type or n-type silicon and in which the dopant is smaller than in the first substrate 10 can be adopted. The first semiconductor layer 20a is formed so that the dopant concentration is gradually decreased from the first substrate 10 side toward the upper surface side. The upper surface portion (the surface on the side opposite to the surface which is in contact with the first substrate 10) of the first semiconductor layer 20a is formed so as to have any one of $p^-$ and $n^-$ dopant concentration having a relatively low concentration, and non-doped concentration. The $p^-$ dopant concentration may be in a range less than $1 \times 10^{16}$ [atoms/cm$^3$]. The $n^-$ dopant concentration may be in a range of less than $5 \times 10^{16}$ [atoms/cm$^3$]. The first semiconductor layer 20a of the present embodiment adopts p-type silicon and is formed so that the dopant concentration of the upper surface portion is $p^-$. That is, the first semiconductor layer 20a includes the first region 20x in the portion which is in contact with the first substrate 10.

Subsequently, silicon is formed by an epitaxial growth on the upper surface in the arrow D1 direction side of the first semiconductor layer 20a, and as shown in FIG. 4(c), the second semiconductor layer 20b is formed. Since the epitaxial growth is performed on the silicon substrate in the second semiconductor layer 20b, compared to a case where the epitaxial growth is performed on a sapphire substrate, lattice defects can be decreased.

As for the second semiconductor layer 20b, a layer which is p-type or n-type silicon and in which the dopant is much compared to the first semiconductor layer 20a can be adopted. The second semiconductor layer 20b is formed so that the dopant concentration is gradually increased from the first semiconductor layer 20a side toward the upper surface side direction of the arrow D1 direction side. The upper surface portion of the second semiconductor layer 20b is formed so as to have any one dopant concentration of $n^{++}$, $n^+$, $p^+$, and $p^{++}$. The second semiconductor layer 20b of the present embodiment adopts p-type silicon and is formed so that the dopant concentration of the upper surface portion is $p^{++}$.

Here, the first semiconductor layer 20a and the second semiconductor layer 20b are separately formed, however, they may be formed continuously. An integral formation of the first semiconductor layer 20a and the second semiconductor layer 20b is performed by adjusting a supply amount of impurities. In the integral semiconductor layer 20A, it is considered that the first semiconductor layer 20a and the second semiconductor layer 20b are divided at an inflection point, in which the increase and decrease in the dopant concentration are changed.

In the semiconductor layer 20A formed in this way, the dopant concentration in the middle portion in the thickness direction is lowest, and the dopant concentration is increased as it approaches the upper surface side and the lower surface side (first substrate 10 side). That is, the semiconductor layer 20A includes the first region 20x on the first substrate 10 side in the thickness direction, and includes a second region 20y on the main surface side opposite to the first substrate 10. The second region 20y is formed so that the dopant concentration is decreased from the main surface of the semiconductor layer which is on the side opposite to the first substrate 10, toward the first substrate 10 side of the semiconductor layer in the thickness direction of the semiconductor layer. Moreover, in this example, the dopant concentration in the main surface on the side opposite to the first substrate 10 of the second region 20y is higher than the threshold. In addition, an intermediate region 20z in which the dopant concentration is less than or equal to the threshold is provided between the first region 20x and the second region 20y.

In the above-described step, in the first semiconductor layer 20a and the second semiconductor layer 20b, the epitaxial growth may not be performed until the diffusion concentration of the dopant is saturated.

Subsequently, the second semiconductor layer 20b of the semiconductor layer 20A is etched from the arrow D1 direction side, and as shown in FIG. 5(a), the thickness of the second semiconductor layer 20b is decreased. The etching can be performed by adopting a selective etchant in which the etching speed is greatly changed due to differences in the dopant concentration. If the dopant concentration exceeds or is less than a predetermined value, the selective etchant is adjusted so that the etching speed is significantly decreased. For example, examples of the selective etchant include a mixture of hydrofluoric acid, nitric acid and acetic acid, and a mixture of hydrofluoric acid, nitric acid and water. In the present embodiment, similar to the etchant in the first embodiment, the mixture of hydrofluoric acid, nitric acid, and acetic acid is adopted as the etchant. In the second semiconductor layer 20b, the second region 20y is etched. Here, the second semiconductor layer, in which the thickness is decreased by etching, becomes a second thin layer 21b.

Subsequently, as shown in FIG. 5(b), similar to FIG. 1(c), the second substrate 30 of insulation is prepared.

Subsequently, as shown in FIG. 5(c), the second substrate 30 and the upper surface in the first direction side of the second thin layer 21b are bonded to each other. As for the bonding method, it is possible to use the method similar to the bonding between the second substrate 30 and the semiconductor layer 20 in the first embodiment.

Through the steps up to here, an intermediate product, which includes the semiconductor layer 20A between the first substrate 10 and the second substrate 30, is generated.

Subsequently, as shown in FIG. 6(a), the thickness of the first substrate 10 is decreased by processing the intermediate product from the arrow D2 direction side. As for the processing method of decreasing the thickness, the method similar to the method described using FIG. 2(b) in the first embodiment can be used. Here, the first substrate in which the thickness is decreased becomes the first thin substrate 11.

In addition, as shown in FIG. 6(b), the thickness of the first semiconductor layer 20a of the semiconductor layer 20A is decreased by performing etching using an etchant after the grinding. This etching can be performed by adopting a selective etchant in which the etching speed is greatly changed due to difference of the dopant concentration. Examples of the selective etchant include etchants similar to those described above. In the first semiconductor layer 20a, the first region 20x is etched. Here, the first semiconductor layer in which the thickness is thinned by etching becomes a first thin layer 21a. In addition, when the first substrate 10 or the first thin substrate 11 remains, the remaining first substrate 10 or the first thin substrate 11 is also etched.

Figure 7:
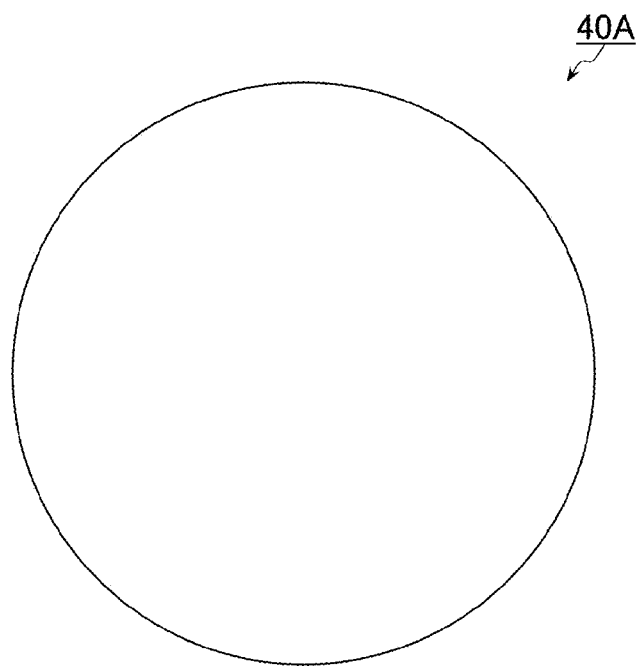
FIG. 7(a) is a plan view showing a schematic configuration of a composite substrate according to an embodiment of the invention.
FIG. 7(b) is a perspective view showing the composite substrate a part of which is viewed in cross section.
Figure 7:
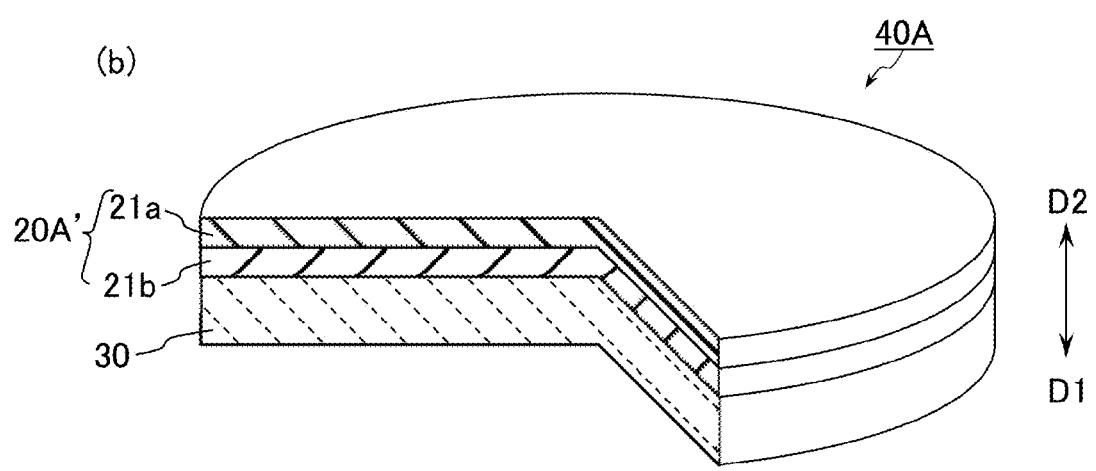

Through the steps up to here, as shown in FIG. 7, a composite substrate 40A can be manufactured which has a semiconductor layer 20A' in which one main surface is bonded to the substrate 30 on the upper surface of the arrow D2 direction side of the insulating substrate 30. The dopant concentration of the semiconductor layer 20A' is gradually increased from the middle portion in the thickness direction of the semiconductor layer 20A' toward one main surface or the other main surface of the semiconductor layer 20A'. Here, the substrate 30 indicates the second substrate 30 through the above-described manufacturing method. Similarly, the semiconductor layer 20A' indicates the layer in which the second thin layer 21b and the first thin layer 21a through the above-described manufacturing method are laminated. That is, the semiconductor layer 20A' is configured by the intermediate region 20z of the semiconductor layer 20A. In other words, in the composite substrate 40A, the functional layer which includes the second thin layer 21b and the first thin layer 21a is bonded to the upper surface of the arrow D2 direction side of the second substrate 30. When the second thin layer 21b and the first thin layer 21a are considered as a single functional layer, in the dopant of the semiconductor layer, the middle portion in arrow directions D1 and D2 is smaller than both end sides. Conversely, the dopant of the functional layer is gradually increased from the middle portion in the thickness direction of the functional layer toward both end sides in the thickness direction of the functional layer. In addition, when the dopant concentration is considered as magnitude of electric resistance, the electric resistance of the functional layer is gradually decreased from the intermediate portion toward both end sides in the thickness direction of the functional layer.

In the above-described manufacturing method, gradient of the dopant concentration is formed on the surface of the side which is to be bonded to the second substrate 30 before being bonded to the second substrate 30. In this way, since the gradient is formed before the bonding, compared to a case where the gradient is formed after the bonding, unevenness of the thickness of the functional layer which is formed on the upper surface of the second substrate 30 can be decreased. If the gradient is formed after the bonding, since the processing is performed from the lower surface of the first substrate 10, the functional layer is subjected to influence of unevenness of the thickness of the first substrate 10 or to influence of warping of the second substrate 30. A case where the functional layer in which the thickness is smaller than at least one of an unevenness amount of the thickness of the first substrate 10 and a warping amount of the second substrate 30 is formed is particularly effective.

As the above-described manufacturing method, since the dopant concentration is designed in the thickness direction of the semiconductor layer 20A, the dopant concentration of the portion which is left as the functional layer can be freely designed. For example, even when the dopant concentration of not less than the threshold is required in the functional layer, a functional layer having a desired dopant concentration can be accurately manufactured in a desired thickness.

In the above-described example, before the second semiconductor layer 20b is bonded to the second substrate 30, the etching step which removes the second region of the second semiconductor layer 20b is provided. However, when the layer having a low resistivity is left as the functional layer, the etching step may be omitted.

In the above-described example, the second region 20y is formed so as to have the dopant concentration of not less than the threshold in the main surface on the side opposite to the first substrate 10. However, the dopant concentration of the second region may be less than or equal to the threshold.

Modified Examples of First Embodiment and Second Embodiment

In the example of each embodiment described above, when the semiconductor layers 20 and 20A and the second substrate 30 are bonded to each other, the main surfaces of the semiconductor layers 20 and 20A on the side opposite to the first substrate 10 may be in an amorphous state.

Moreover, it is preferable that the semiconductor layers 20 and 20A are formed so as to have the thickness of not less than an undulation level of the second substrate 30. For example, when a sapphire substrate is used as the second substrate 30, since the sapphire substrate has an undulation level of an approximately 10 μm, it is preferable that the thicknesses of the semiconductor layers 20 and 20A are equal to or more than 10 μm. The semiconductor layers are formed in this way, and thus, the functional layer 21 having a desired thickness can be formed without receiving adverse effects of an undulation level of the second substrate 30.

Moreover, while, in the above-described example, the first region 20x having a desired rate of change of a resistivity is implemented via the semiconductor layer 20, 20A epitaxially grown on the first substrate 10, the first region 20x may be implemented via another means. For example, a high-resistivity silicon substrate and a low-resistivity silicon substrate are bonded to each other under heat, and a dopant is diffused from the low-resistivity substrate to the high-resistivity substrate, whereby a region corresponding to the first region 20x suggested in the present application can be formed on a side of the high-resistivity substrate which is in contact with the low-resistivity substrate. On an as needed basis, the low-resistivity substrate and the high-resistivity substrate may be partly thinned, with at least the first region 20x left intact.

And, if the high-resistivity substrate is thinned, the surface of the thinned part is bonded to an insulating substrate.

In addition, while, in the above-described example, the case where the entire first substrate 10 has a dopant in a concentration higher than the threshold has been described as an example, the first substrate 10 may be so designed that only a region extending continuously from the surface where the semiconductor layer 20, 20A is formed toward a certain part in the thickness direction has a dopant in a concentration higher than the threshold. In this case, a Si substrate having a dopant concentration of lower than or equal to the threshold is prepared, and, the dopant is diffused, by means of heat diffusion or otherwise, from the surface where the semiconductor layer 20, 20A is formed, whereby the first substrate can be prepared.

Modified Examples of First Embodiment and Second Embodiment

The semiconductor layer 20, 20A may be so formed that the resistivity is gradually increased with increase in distance from the first substrate 10 at a change rate of 10 Ω·cm/μm or more, including a resistivity corresponding to the threshold (hereafter referred to as "first resistivity value" or "threshold resistivity") which exists as an in-between value in the range of the change rate. Such a change rate of resistivity can be controlled by adjusting the gradient of dopant concentration.

In order to increase the rate of change of the resistivity, it is advisable to form the semiconductor layer 20, 20A by an epitaxial growth under conditions of lower substrate temperature, shorter growth time, and smaller film thickness. Specifically, the above-described change rate can be obtained by fulfilling the following conditions, for example. That is, when the semiconductor layer 20, 20A is formed by an epitaxial growth, dopant gradient is formed on the semiconductor layer 20, 20A in the thickness direction solely by dopant diffusion from the first substrate 10 without provision of a dopant, and thereby gradient of resistivity is formed. At this time, the substrate temperature for epitaxial growth is adjusted to fall in a range of about 900° C. to 1200° C., and the time for growth is adjusted to fall in a range of 5 minutes to 60 minutes. The semiconductor layer 20, 20A is so formed that the value of resistivity at the outermost surface (namely, the main surface opposite to the first substrate 10) of the epitaxially-grown semiconductor layer 20, 20A falls in a range of 10 to 20 Ω·cm. In other words, the dopant concentration of the semiconductor layer 20 is decreased with increase in distance from the first substrate 10, and, the surface on the side opposite to the surface which is in contact with the first substrate 10 becomes a completely-depleted layer.

In the semiconductor layer 20, 20A, a region having such a rate of change of resistivity is defined as a third region 20m. In the third region 20m, the resistivity changes at a change rate of 10 Ω·cm/μm or more, including the first resistivity value which exists as an in-between value in the range of the change rate. That is, the semiconductor layer 20, 20A is formed so as to comprise the third region 20m in the thickness direction by adjusting a dopant concentration. And the third region 20m has a resistivity which is continuously increased in distance from the first substrate 10 at a change rate of 10 Ω·cm/μm or more in the thickness direction. And the third region 20m has the threshold resistivity corresponding to the threshold in an intermediate portion of the thickness direction.

Figure 8:
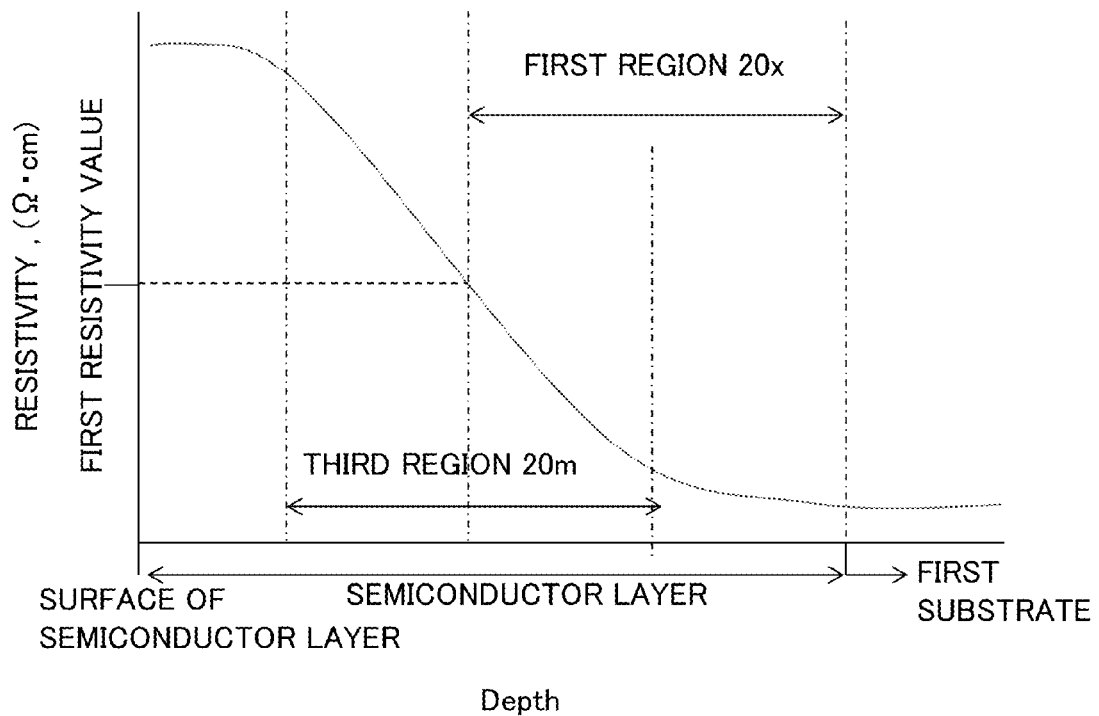
FIG. 8 is a schematic chart showing a state of changing of resistivity with respect to a thickness direction in a first substrate and a semiconductor layer.

With such a semiconductor layer 20 taken up as an example, the third region 20m will be described in detail with reference to FIG. 8. In FIG. 8, there is schematically shown a state of changing of resistivity in the range from the surface of the semiconductor layer 20 (the main surface on the side opposite to the surface which is in contact with the first substrate 10) to a middle portion of the first substrate 10 with respect to the thickness direction. The resistivity of the side of the semiconductor layer 20 in contact with the first substrate 10 is equal to the resistivity of the first substrate 10. After that, the resistivity is gradually increased with increasing proximity to the surface side of the semiconductor layer 20 (with increase in distance from the first substrate 10). It will be seen that, in a region near the first substrate 10 and a region near the surface of the semiconductor layer 20 as well, the slope of a curve indicative of the rate of change of resistivity is gentle. Thus, a region in which the resistivity changes at a change rate of 10 Ω·cm/μm or more, including the first resistivity value which exists as an in-between value in the range of the change rate, is defined as the third region 20m. The first region 20x extends from the side in contact with the first substrate 10 to a position in the thickness direction where the resistivity reaches the first resistivity value. Therefore, the third region 20m is disposed in partly-overlapping relation to the first region 20x.

While, in the above-described example, the case where the third region 20m corresponds only to a middle portion of the semiconductor layer 20 in the thickness direction has been described as an example, the invention is not limited to this example. For example, so long as the conditions for the rate of change of resistivity are fulfilled, the third region 20m may be made as the semiconductor layer 20 as a whole, or may be made as a region extending continuously from the side in contact with the first substrate 10 (so as to include the whole of the first region 20x) or a region extending from a middle portion in the thickness direction to the surface of the semiconductor layer 20.

Figure 9:
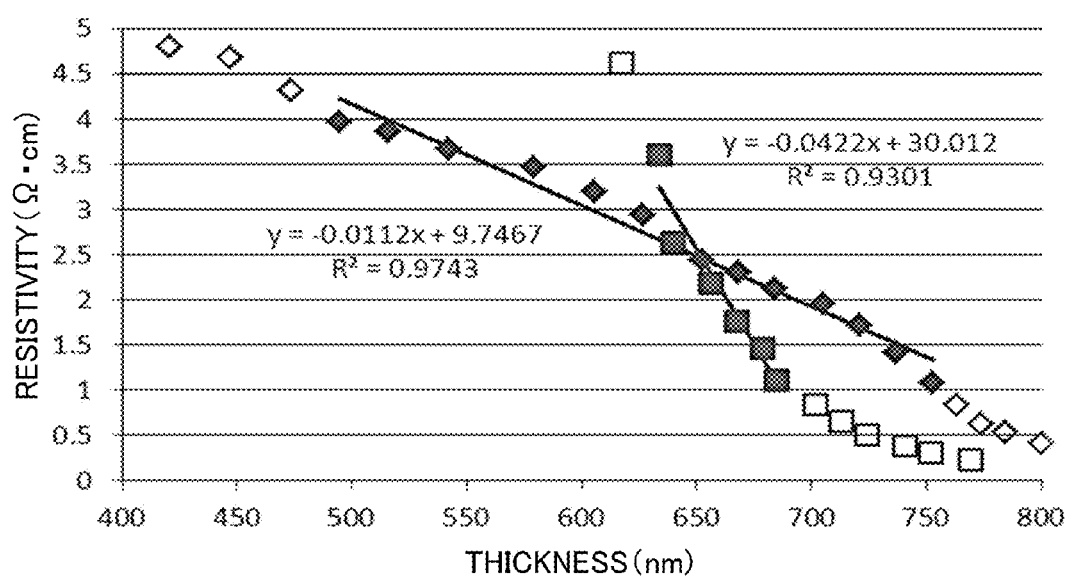
FIG. 9 is a chart showing a state of changing of resistivity with respect to the thickness direction in the semiconductor layer.

In the above-described process step, a portion where the dopant concentration takes on a threshold value (namely, a portion where the resistivity takes the first resistivity value) is made to serve as an etching stopper portion by means of selective etching. Since the resistivity of the etching stopper portion changes at a change rate of 10 Ω·cm/μm or more, variation in film thickness of the functional layer 21 can be suppressed. FIG. 8 shows the rate of change of resistivity with respect to the thickness direction. FIG. 9 is related to a case where the semiconductor layer 20 is formed on the first substrate 10 as shown in FIG. 1(b), in which the abscissa axis represents thickness of the semiconductor layer 20 from the outermost-surface side, and the ordinate axis represents resistivity corresponding to each thickness. As shown in FIG. 8 and FIG. 9, the resistivity of the semiconductor layer 20, 20A is gradually increased with increase in distance from the first substrate 10. Now, attention is directed toward the rate of change of resistivity at the first resistivity value. When the first resistivity value is reached under selective etching, then the etching rate is decreased greatly. However, in reality, an etching liquid undergoes slight deterioration during etching, or the resistivity of the semiconductor layer 20 exhibits in-plane variation. Even if there is variation in the conditions, by increasing the rate of change of resistivity in the third region 20m, it is possible to minimize variance from a desired position in the thickness direction where etching is to be stopped.

Such a rate of change of resistivity can be determined by directly measuring resistivity by means of SRP (Spreading Resistance Profiler).

The rate of change can be determined by any of a process of defining a thickness-wise position where the first resistivity value is reached as a center position and then obtaining resistivity corresponding to a thickness-wise position in the vicinity of the center position, a process of postulating an approximate straight line by means of least square approximation or otherwise using similar values and then obtaining a relevant value on the basis of the slope of the straight line, and a process of determining a tangential line at a thickness-wise position where the first resistivity value is reached after establishing a relationship between the change of resistivity and the thickness direction and then obtaining a relevant value on the basis of the slope of the tangential line. In the case of which the rate of change is obtained by postulating an approximate straight line by means of least square approximation, the third portion $20m$ is defined by the range that a coefficient of determination R2 of an approximate straight line is 0.7 and over.

Figure 10:
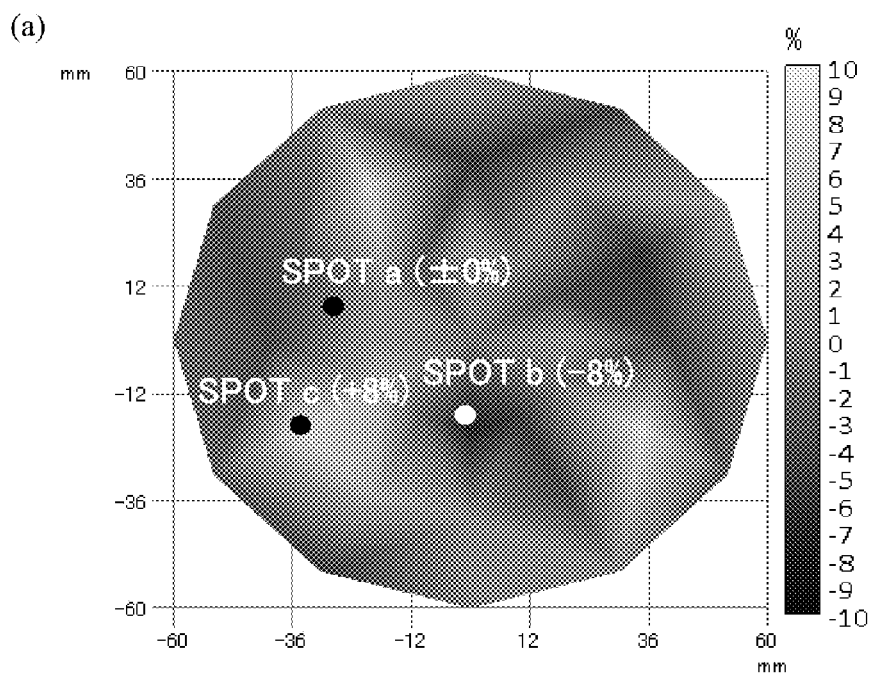
FIG. 10(a) is a view showing an in-plane resistivity distribution of the semiconductor layer.
FIG. 10(b) is a view showing a thickness-wise resistivity distribution of the semiconductor layer.
Figure 10:
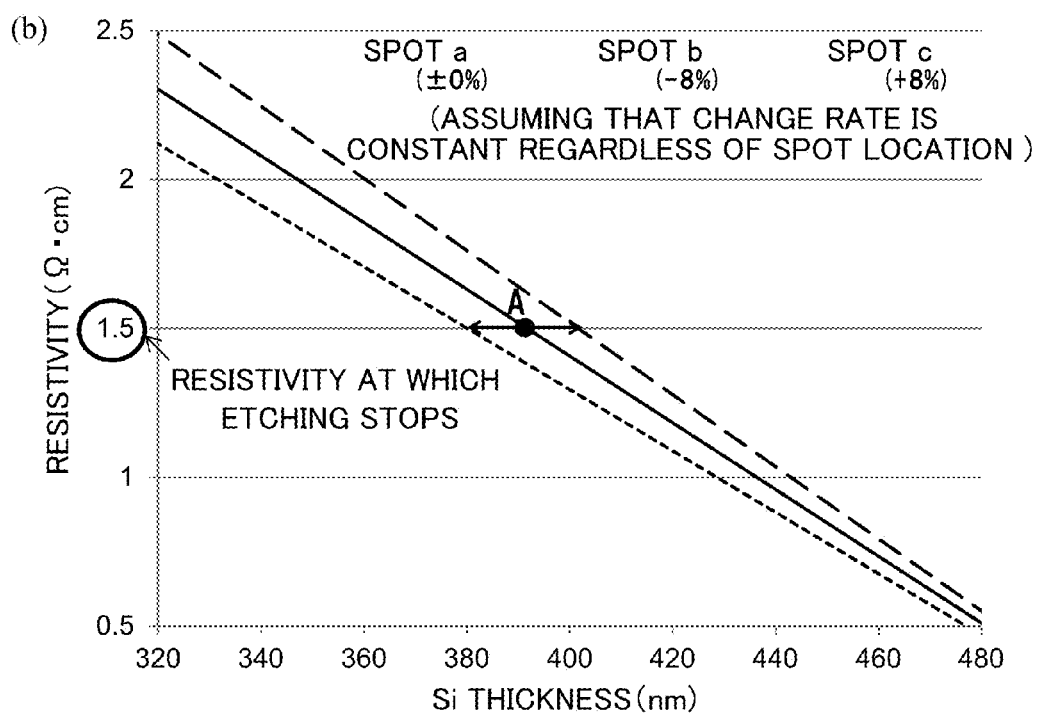

In the above-described example, the rate of change of resistivity with respect to the thickness direction in the third region $20m$ is adjusted to be 10 Ω·cm/μm or more. Now, advantageous effects will be examined specifically. In the above-described embodiment, the semiconductor layer 20, 20A is formed by an epitaxial growth. In general, an epitaxial layer has an in-plane resistivity (dopant concentration) distribution under the influence of the flow of gas during manufacturing operation (hereafter referred to as "in-plane resistivity distribution"). FIG. 10(a) shows the in-plane resistivity distribution of the upper surface of the semiconductor layer 20, 20A obtained in accordance with the present embodiment.

According to the in-plane resistivity distribution shown in FIG. 10(a), the semiconductor layer 20, 20A has been found to have an in-plane distribution of ±8% with respect to a median. Let it be assumed that such an in-plane resistivity distribution exists similarly in each and every thickness-wise position. In this case, as shown in FIG. 10(b), the changes of resistivity corresponding to the upper limit, the lower limit, and the median, respectively, with respect to the thickness direction are indicated by a broken line, a dotted line, and a solid line, respectively. Here, variation in film thickness at the first resistivity value are indicated by an arrow A. Specifically, as shown in FIG. 10(b), the variation value is about 20 nm at a change rate of about 11 Ω·cm/μm, which equates to about ±3% variation. Such a thickness variation A can be decreased with increase in the rate of change of resistivity with respect to the thickness direction. It is thus desirable to adjust the rate of change of resistivity with respect to the thickness direction in such a way that the thickness variation A is less than or equal to the in-plane resistivity distribution (±8% in this example). In this way, the semiconductor layer 20, 20A can be thinned without widening the range of variation in etching amount ascribable to the in-plane resistivity distribution that has existed from the outset of formation of the semiconductor layer 20, 20A.

Modified Examples of First Embodiment and Second Embodiment

As a method of bonding the semiconductor layer 20, 20A and the second substrate 30 together, when using the method which performs the bonding at a normal temperature by activating the surfaces to be bonded, metal may find its way into the surfaces to be bonded. Such a metal can be added as intended by performing etching under neutron beam or ion beam irradiation on a structure which releases metal when the to-be-bonded surfaces are activated. The metal thereby supplied becomes an interface inclusion which is interposed between the second substrate 30 and the semiconductor layer 20, 20A. It is preferable that, in the interface inclusion, constituent metal atoms are distributed at a presence density of $1×10^{12}$/cm$^2$ or less. The presence density in the interface inclusion is found at a region in the vicinity of the interface of bonding between the second substrate 30 and the semiconductor layer 20, 20A.

Examples of metal elements constituting the interface inclusion include Fe, Cr, Ni, Cu, and Zn. However, the elements used as the major constituents of the semiconductor layer 20, 20A and the second substrate 30 are excluded. The amount of metal supply is determined with consideration given to the density at the interface, and more specifically, for example, the amount of Fe can be set at $1.5×10^5$ ng/cm$^3$.

The amount of supply of the interface inclusion can be controlled by, in a vacuum chamber constituting a bonding apparatus, adjusting the area of that part of a metal-made constituent member which is exposed from a cover member, as well as to the degree of vacuum. In this example, the constituent member is covered by the cover member, with part of it left uncovered. It is desirable to set the degree of vacuum at a relatively high value from the standpoint of reducing the amount of supply of the interface inclusion, and more specifically the degree of vacuum is preferably $10^1$ to $10^2$ order higher than the degree of vacuum at which a neutron beam can be emitted with stability. Moreover, by effecting activation with neutron beams, the bonding strength can be enhanced, and also the amount of supply of metal atoms constituting the interface inclusion can be reduced.

By forming the interface inclusion so that metal atoms are distributed at a density per unit surface area of $10^{12}$ atoms/cm$^2$ or less, the metal atoms will not cover one main surface of the second substrate 30 and one main surface of the semiconductor layer 20, 20A, so that the atomic arrangement of the elements constituting one main surface of the second substrate 30 and one main surface of the semiconductor layer 20, 20A can be left exposed.

Here, the density of metal atoms refers to the number of atoms per unit surface area. In reality, with use of ICP-MS (Inductively Coupled Plasma Mass Spectrometry), part of the semiconductor layer 20, 20A formed on the second substrate 30 is dissolved in an etching liquid of a certain volume, and the amount of metal elements is measured, and, on the assumption that a total of the metal elements exists within the range of a thickness of 5 nm from the interface, a density in a planar direction is determined. Such an assumption is based on the fact that, as the result of observation and measurement of the state of distribution of metal elements in the thickness direction in a plurality of composite substrates obtained in accordance with the present embodiment, even in a case where the amount of metal was maximum, the metal elements existed within the 5 nm range in between the second substrate 20 and the semiconductor layer 20, 20A, and were diffused little in other region toward the semiconductor layer 20, 20A.

In light of the foregoing, the region in the vicinity of the interface of bonding between the second substrate 20 and the semiconductor layer 20, 20A is defined as a region extending for 5 nm from the bonded surfaces in the thickness direction.

It becomes possible to suppress occurrence of agglomeration and deposition of metal at the interface while maintaining the bonding only after adjusting the presence density of metal atoms to be $10^{12}$ atoms/cm$^2$ or less. The mechanism just described will be described below in detail.

In the presence of metal agglomeration in between the second substrate 30 and the semiconductor layer 20, 20A, when a semiconductor device is produced on the semiconductor layer 20, 20A, there is a possibility of a detrimental effect on the operation of the semiconductor device. Such a metal agglomeration is a problem accepted as a foregone conclusion when the interface inclusion is layer-shaped or island-shaped (for example, the density of metal atoms at the interface is about $3.0 \times 10^{16}$ atoms/cm$^2$ or more). However, even if the density is less than about $3.0 \times 10^{16}$ atoms/cm$^2$, when the value of $10^{12}$ atoms/cm$^2$ is exceeded, the metal atoms are dispersed within the bonded surfaces at the time of bonding and thus the existence thereof cannot be confirmed, but, in the course of heat treatment for the production of a semiconductor device, inconveniently, metal agglomeration will take place. However, by adjusting the density to be $10^{12}$ atoms/cm$^2$ or less, even if the composite substrate 40 is subjected to heat treatment, metal agglomeration can be prevented.

This is, although the mechanism is still unknown, presumably associated with the solid solubility of metal with respect to the elements constituting the second substrate 30 and the semiconductor layer 20, 20A. That is, by adjusting the density of metal atoms to be $10^{12}$ atoms/cm$^2$ or less, since metal atoms do not make contact with each other so as to form an aggregate at this density, and also, since the mobility of metal atoms is low at a normal temperature, it never occurs that an aggregate is formed during the bonding. In addition, even if the mobility is increased under heat treatment after the bonding, by setting the presence density in the prescribed range, since metal exists in an amount of only about ten times the solid solubility, it can be considered that no aggregate will be formed in this state.

Moreover, the great majority of metal atoms are contained in the form of solid solution, in the elements constituting the second substrate 30 and the semiconductor layer 20, 20A, and also the amount of the remainder of metal atoms is too small to promote metal diffusion in the semiconductor layer 20, 20A.

In addition, when the semiconductor layer 20, 20A is made of Si and the metal elements constituting the interface inclusion include Fe, if the density is greater than $10^{12}$ atoms/cm$^2$, OSF defects will be rapidly increased upon reaching this value. As a cause of the OSF defect, a lattice defect is known. Starting with this defect, a compound of Fe and O is moved to and deposited on the surface, which may result in OSF defects. There is agreement between the threshold of abundance of Fe resulting from OSF defects and the upper limit of the density of metal atoms in this embodiment.

Although there is no direct relationship between OSF defects and metal agglomeration, with attention given to the phenomena of movement of metal atoms in the semiconductor layer and ensuing agglomeration and deposition, there is a common denominator between them. Then, as factors of occurrence of OSF defects, the presence of defects and the union of metal (Fe) and oxygen will be studied. Here, in the composite substrate 40, 40A of the present embodiment, the semiconductor layer 20, 20A and the second substrate 30 are directly bonded to each other by activating their to-be-bonded surfaces for forming a dangling bond. Thus, there is a possibility that the dangling bond remains as a defect at the bonded interface in the composite substrate 40, 40A. There is also a possibility that, due to heat treatment for the production of a semiconductor device after the bonding, an intermetallic compound is formed at the bonded interface by the metal elements and the elements constituting the semiconductor layer 20, 20A or the second substrate 30. These two assumptions, namely the simultaneous existence of a defect and an interface inclusion resulting from the intermetallic-compound formation at the interface represents the presence of both of the two factors of occurrence of OSF defects. Thus, in the composite substrate 40, 40A of the present embodiment, it is suggested that, as the case with OSF defects caused by movement of deposition of Fe due to defects, metal atoms may be moved and deposited due to interfacial defects. In light of the foregoing, presumably, the diffusion and agglomeration of metal atoms can be suppressed by adjusting the density of metal atoms of the interface inclusion to be less than or equal to the threshold at which OSF defects occur.

It is noted that the lower limit of the density of metal atoms is not limited to a specific value, but has to be set at a level necessary for the bonding of the second substrate 30 with the semiconductor layer 20, 20A at a normal temperature. Specifically, it has been confirmed that, so long as the density of metal atoms is $10^{10}$ atoms/cm$^2$ or more during the bonding, it is possible to ensure a bonding strength equivalent to that obtained in a case where bonding is performed in the presence of a large amount of metal in conformity to the invention disclosed in Japanese Examined Patent Publication JP-B2 4162094.

As described heretofore, according to the present modified example, the composite substrate 40 can be provided that has the semiconductor layer 20, 20A capable of suppression of metal diffusion and exhibits an adequate strength of bonding between the second substrate 30 and the semiconductor layer 20, 20A.

By imparting such a density as shown herein to the interface inclusion, agglomeration of metal atoms at the bonded interface can be prevented.

Moreover, in this example, since the semiconductor layer 20, 20A is composed of a film formed by an epitaxial growth, the concentration of oxygen is less than $10^{18}$ atoms/cm$^3$, and thus occurrence of OSF defects can be suppressed, with a smaller amount of metal and a smaller amount of oxygen as well.

Modified Examples of First Embodiment and Second Embodiment

It is preferable that the metal atoms constituting the above-described interface inclusion form a metal compound in conjunction with the elements constituting the semiconductor layer 20, 20A and the elements constituting the second substrate 30. In order for the metal atoms to exist in the form of an intermetallic compound such as a metal oxide, following the bonding step, heat treatment is carried out for 0.5 hour or more at a temperature of 500° C. or higher. Through such a heat treatment, the elements constituting the semiconductor layer 20, 20A or the second substrate 30 and the metal constituting the interface inclusion combine with each other, thereby forming an intermetallic compound. The metal atoms, being supplied at the time of activation of the bonded surfaces of the semiconductor layer 20, 20A and the second substrate 30, exist at the bonded interface, and form a bond with atoms present at the bonded surface of the second substrate 30 under heat treatment.

Since the composite substrate 40 is so designed that the amount of metal present at the bonded interface is set to be $10^{12}$ atoms/cm$^2$ or less, the diffusion and agglomeration of metal atoms can be suppressed. Accordingly, the metal atoms in the form of an intermetallic compound remain at the interface of bonding between the semiconductor layer 20, 20A and the second substrate 30. When the metal atoms form an intermetallic compound, a vacancy is developed around it due to the provision of the elements constituting the semiconductor layer 20, 20A and the elements constituting the second substrate 30 for combination with the metal elements. This vacancy becomes a defect, so that, when new impurities appear at the interface, impurity gettering can be effected to suppress diffusion to the semiconductor layer 20.

Modified Examples of First Embodiment and Second Embodiment

In the above-described embodiment, it is desirable to use an R-plane sapphire substrate for the second substrate 30.

Since the lattice spacing at the R-plane of the sapphire substrate and the lattice constant of Si single crystal are close compared to the case of a C-plane sapphire substrate, etc., it is possible to obtain a composite substrate capable of suppression of irregularities in crystal structure on the side of one main surface 20b of the semiconductor layer 20, 20A caused by a lattice-constant mismatch.

Especially in a case where the density of the interface inclusion falls in a range of $10^{10}$ atoms/cm$^2$ or more to $10^{12}$ atoms/cm$^2$ or less, the atoms constituting the second substrate 30 and the atoms constituting the semiconductor layer 20, 20A are bonded to each other at a very high rate. Specifically, in this example, the total number of atoms per square centimeter is assumed to be about $10^{16}$ atoms, wherefore the rate of the bonding through the metal elements constituting the interface inclusion is expressed in the order of ppm.

Accordingly, lattice constant in the second substrate 30 and the semiconductor layer 20, 20A holds great significance. That is, since there is a closeness in lattice constant, or there is little lattice-constant mismatch, the second substrate 30 and the semiconductor layer 20, 20A can be firmly bonded to each other, and also, since the semiconductor layer 20, 20A is less prone to crystal structure irregularities, it is less likely that the semiconductor device will suffer from characteristic degradation due to occurrence of transfer which is responsible for carrier trapping or development of an unintended stress caused by strains.

Moreover, since the second substrate 30 and the semiconductor layer 20, 20A can be directly bonded to each other under conditions of little lattice-constant mismatch, it is possible to make full use of the semiconductor characteristics of Si without any impairment, as well as to suppress occurrence of capacitance between the second substrate 30 and the semiconductor layer 20, 20A. That is, the composite substrate 40 and 40A capable of taking advantage of both the semiconductor characteristics of the Si-made semiconductor layer 20, 20A and the low-dielectric-constant characteristics of the sapphire-made second substrate 30 can be provided.

Moreover, in the case of utilizing an R-plane sapphire substrate for the second substrate 30, on the surface thereof bonded to the semiconductor layer 20, 20A, there is an arrangement of Al atoms, but O atoms are not left exposed. This makes it possible to bond the second substrate 30 and the semiconductor layer 20, 20A together without any involvement of O atoms that may cause OSF defects in the bonding, and thereby suppress occurrence of OSF defects. In addition, even in the case of utilizing an insulator oxide for the second substrate 30, since metal atoms can be combined with each other, the bonding strength can be enhanced.

(Electronic Component)

It is noted that electronic components can be formed by creating a plurality of device portions in the composite substrate 40, 40A in accordance with the above-described embodiments and modified examples, and dividing the composite substrate 40, 40A into pieces each including at least one device portion.

Figure 11A:
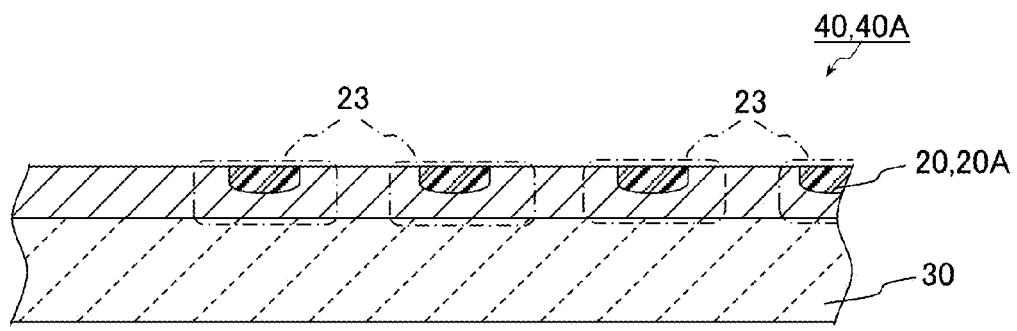
FIGS. 11A and 11B are schematic sectional views showing a method of manufacturing an electronic component according to one embodiment of the invention.

Specifically, as shown in FIG. 11A, device portions 23 are created on the upper-surface side of the semiconductor layer 20, 20A of the thusly obtained composite substrate 40, 40A. Examples of the device portions 23 include various semiconductor structures, such as CMOS (Complementary MOS) and MOSFET (Metal-Oxide-Semiconductor Field-Effect Transistor).

Figure 11B:
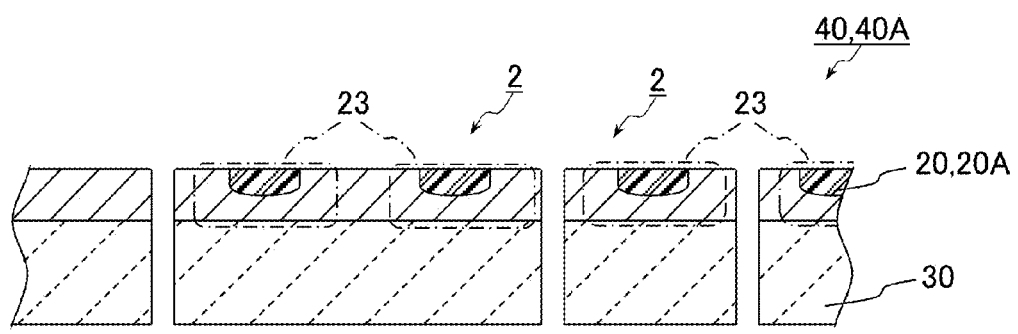

Next, as shown in FIG. 11B, the composite substrate 40, 40A formed with the device portions 23 is divided into pieces to produce electronic components 2. At this time, the composite substrate 40 is divided in such a way that at least one device portion 23 is included in one electronic component 2. In other words, a plurality of device portions 23 may be included in one electronic component 2.

In the manner as above described, the electronic component 2 having the device portion 23 can be produced.

REFERENCE SIGNS LIST

10: First substrate
11: First thin substrate
20: Semiconductor layer
20m: Third region
20x: First region
20y: Second region
20z: Intermediate region
21: Functional layer
30: Second substrate
40: Composite substrate

What is claimed is:

1. A method of manufacturing a composite substrate, comprising:
   preparing a first substrate which is formed of a first silicon having a dopant;
   forming a semiconductor layer formed by an epitaxial growth a second silicon on a main surface of the first substrate;
   following the forming of the semiconductor layer, bonding the semiconductor layer and a second substrate of insulating; and
   after the bonding, selectively etching the semiconductor layer from a side of the first substrate up to a middle portion in a thickness direction of the semiconductor layer by using an etchant, wherein
   the etchant has an etching rate with respect to silicon which decreases by a not less than an certain value in a dopant concentration of a threshold lower than a dopant concentration of the first substrate,
   in the forming the semiconductor layer, the semiconductor layer is formed so as to comprise a first region in a thickness direction of the first substrate, the first region being in contact with the first substrate and in which a dopant concentration thereof decreases to the threshold as a distance from the first substrate increases, and
   in the bonding the semiconductor layer and the second substrate, bonding the semiconductor layer and the second substrate is performed by activating main surfaces of both which are bonded to each other and then bringing the main surfaces of both into contact with each other at a normal temperature which is 200° C. or lower.

2. The method of manufacturing a composite substrate according to claim 1, wherein,
   in the forming the semiconductor layer, the semiconductor layer is formed so that the dopant concentration decreases as the distance from the first substrate increases.

3. The method of manufacturing a composite substrate according to claim 2, wherein,
   in the forming the semiconductor layer, the epitaxial growth of the semiconductor layer is performed by diffusing the dopant from the first substrate, the diffusing being finished before the dopant concentration is saturated.

4. The method of manufacturing a composite substrate according to claim 1, wherein,
in the forming the semiconductor layer, the semiconductor layer is formed so as to comprise a second region in the thickness direction of the semiconductor layer, the second region has a dopant concentration being gradually decreased from a main surface on a side opposite to the first substrate toward a side of the first substrate.

5. The method of manufacturing a composite substrate according to claim 4, wherein,
in the forming the semiconductor layer, the semiconductor layer is formed so that the dopant concentration of the main surface on the side opposite to the first substrate in the second region is higher than the threshold.

6. The method of manufacturing a composite substrate according to claim 4, wherein,
in the forming the semiconductor layer, the semiconductor layer is formed so as to comprise an intermediate region between the first region and the second region, the intermediate region having a dopant concentration which is less than or equal to the threshold.

7. The method of manufacturing a composite substrate according to claim 4, further comprising:
removing a part of the second region of the semiconductor layer in a thickness direction by etching, the removing being carried out between of the forming the semiconductor layer and the bonding the semiconductor layer and the second substrate.

8. The method of manufacturing a composite substrate according to claim 1, wherein,
in the forming the semiconductor layer, the semiconductor layer is formed so as to have a thickness of not less than an undulation level of the second substrate.

9. The method of manufacturing a composite substrate according to claim 1, wherein,
in the bonding the semiconductor layer and the second substrate, the main surface of the semiconductor layer on the side opposite to the first substrate is made into an amorphous state.

10. The method of manufacturing a composite substrate according to claim 1, wherein,
in the forming the semiconductor layer, the semiconductor layer is formed so as to comprise a third region in the thickness direction thereof by adjusting a dopant concentration, wherein the third region has a resistivity of the semiconductor layer which is continuously increased in distance from the first substrate at a change rate of 10 $\Omega \cdot cm/\mu m$ or more in the thickness direction, and has a threshold resistivity corresponding to the threshold in an intermediate portion of the thickness direction.

11. The method of manufacturing a composite substrate according to claim 1, wherein,
in the forming the semiconductor layer, the semiconductor layer is so formed that oxygen concentration is less than $10^{18}$ atoms/cm$^3$.

12. The method of manufacturing a composite substrate according to claim 1, wherein,
in the bonding the semiconductor layer and the second substrate, in a region in a vicinity of a bonded interface, metal atoms that constitute an interface inclusion are distributed at a presence density of $1 \times 10^{12}$/cm$^2$ or less.

13. The method of manufacturing a composite substrate according to claim 1, wherein,
in the selective etching, the first substrate and a region up to the middle portion in the thickness direction of the semiconductor layer are selectively etched by using the same etchant.

* * * * *